United States Patent [19]

Miyazaki et al.

[11] Patent Number: 5,424,368

[45] Date of Patent: Jun. 13, 1995

[54] PHOTOSENSITIVE RESIN COMPRISING A POLYMER HAVING AN AZIDE GROUP IN THE SIDE CHAIN

[75] Inventors: Tadakazu Miyazaki; Masahide Mizumori, both of Osaka; Miki Motomura, Kyoto, all of Japan

[73] Assignee: Sanyo Chemical Industries, Inc., Kyoto, Japan

[21] Appl. No.: 191,218

[22] Filed: Feb. 3, 1994

[30] Foreign Application Priority Data

Mar. 5, 1993 [JP]    Japan .................. 5-071091

[51] Int. Cl.$^6$ ............................................ C08F 265/00
[52] U.S. Cl. .................................... 525/293; 525/390; 525/392; 430/167; 430/195; 430/197; 552/8
[58] Field of Search ............... 430/195, 167, 197, 325; 525/293, 392, 390; 552/8

[56] References Cited

U.S. PATENT DOCUMENTS

| | | | |
|---|---|---|---|
| 4,074,008 | 2/1978 | Green | 430/195 |
| 4,229,514 | 10/1980 | Kurita et al. | 430/195 |
| 5,024,920 | 6/1991 | Morishita et al. | 430/197 |
| 5,254,431 | 10/1993 | Etherington et al. | 525/293 |

FOREIGN PATENT DOCUMENTS 64-13540   1/1989  Japan .
450205     2/1992  Japan .

Primary Examiner—Charles L. Bowers, Jr.
Assistant Examiner—John S. Chu
Attorney, Agent, or Firm—Merchant, Gould, Smith, Edell, Welter & Schmidt

[57] ABSTRACT

A photosensitive resin having at least one group as shown below in Chemical Formula (1) in a molecule.

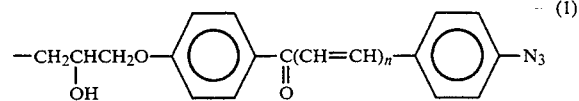

wherein n represents an integer from 1 to 10. Since the photosensitive resin has an azido group in a molecule having an adsorption region higher than 300 nm, the resin is highly sensitive. Therefore, an emulsion coating photo mask or a soda glass photo mask, which allows light permeation within the abosorption region of the azido group and is cheap in industry, can be used as the photo mask for the photosensitive resin of the invention. The photosensitive resin is particularly useful as a photo resist.

9 Claims, No Drawings

PHOTOSENSITIVE RESIN COMPRISING A POLYMER HAVING AN AZIDE GROUP IN THE SIDE CHAIN

BACKGROUND OF THE INVENTION

1. Field of the Invention

This invention relates to a photosensitive resin.

2. Description of the Prior Art

As photosensitive resins with high sensitivity, photosensitive resins having an azido group as a photosensitive functional group have been used, such as a photosensitive resin comprising the mixture of a non-photosensitive polymer and a bisazido type photo cross-linking agent disclosed in Published Unexamined Japanese Patent Application No. Sho 64-13540 and a photosensitive polymer comprising at least two azido groups in a molecule disclosed in Published Unexamined Japanese Patent Application No. Hei 4-50205.

However, since the former photosensitive resin comprises only two photosensitive functional groups in a molecule of the bis-azido type photo crosslinking agent, the resin has low photo crosslinking efficiency and sensitivity to light.

The latter photosensitive resin has an azide group and a sulfonate group directly bonded to an aromatic ring and also has a group of a carbon-carbon double bond conjugated with the aromatic ring. Therefore, sulfonate groups are associated with each other in a coating film formed from the photosensitive resin. As a result, many coupling reaction products (azo type conjugated compounds) are generated due to the coupling reaction between the azido groups near the sulfonate groups, and thus they absorb light useful for a reaction and prevent the inside of the coating film from curing. In other words, the strength of the coating film is not sufficient for practical usage.

SUMMARY OF THE INVENTION

It is an object of the invention to provide a photosensitive resin of high sensitivity which is easily manufactured.

More specifically, the photosensitive resin of the invention comprises a photosensitive resin polymer having at least one group represented by the following Chemical Formula (1) as a side chain the in the polymer:

Chemical Formula (1)

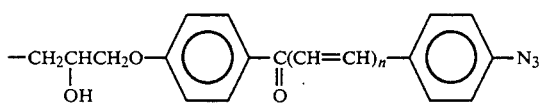

wherein n represents an integer from 1 to 10.

DETAILED DESCRIPTION OF THE INVENTION

The photosensitive resin of the invention comprises a polymer having at least one group of Chemical Formula (1) set forth above as a side chain the polymer. Normally, the photosensitive resin is derived from the reaction between a compound (A) of Chemical Formula (2) and a polymer (B) having at least one active group reactive to epoxide. The compound (A) is represented by the following Chemical Formula (2):

Chemical Formula (2)

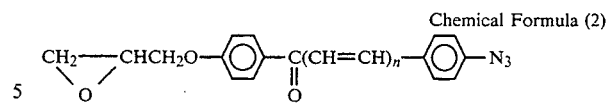

wherein n represents an integer from 1 to 10.

Compound (A) set forth above has an azido group, an epoxy group, and a repeating unit structure of a carbon-carbon double bond conjugated with an aromatic ring in a molecule.

The azido group of the compound (A) generates nitrene as an active group, as a result of sensitizing by electromagnetic waves such as ultraviolet rays and visible rays and corpuscular beams including an electron beam or the like. Then, a dimerization reaction between nitrene, an addition reaction to a double bond, a hydrogen abstraction reaction, and the like are generated by nitrene. Thus crosslinking of polymer molecules is attained and a negative image can be formed. Also, since the azido group contained in compound (A) is located in the position which is conjugated with a chalcone group, its absorption region of ultraviolet rays is higher than 300 nm. Therefore, the photosensitive resin of the invention derived from compound (A) becomes highly sensitive.

The epoxy group becomes a reaction site for the active group contained in polymer (B).

In addition, n indicated in Chemical Formula (1) set forth above represents an integer from 1 to 10, preferably from 1 to 3. The absorption range is likely to be shifted toward longer wavelength on the radiation spectrum as n increases. However, there is little expectation of improvement in the effects of the photosensitive resin when n becomes too large.

Compound (A) is synthesized by the following steps:

dissolving a compound as shown in the following Chemical Formula (3), epichlorohydrin and benzyltrimethylommonium chloride in an aprotic polar solvent, Chemical Formula (3)

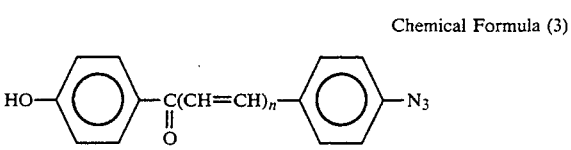

wherein n represents an integer from 1 to 10;

adding beaded sodium hydroxide at a temperature lower than 40° C.; and aging at the temperature lower than 40° C.

These steps are indicated by the following formula.

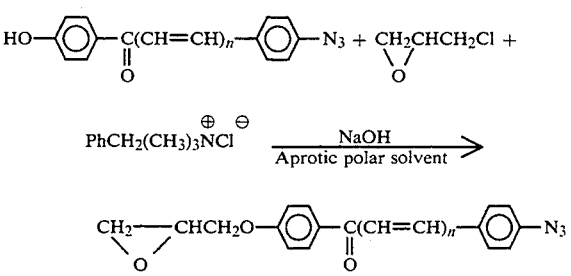

wherein n represents an integer from 1 to 10.

As the active group contained in polymer (B), which is reactive to epoxide, a carboxyl group, an amino group, an imino group, a phenolic hydroxyl group, an alcoholic hydroxyl group and a mercapto group are illustrated. Among these, a carboxyl group, an amino group and a phenolic hydroxyl group are preferable.

As the polymer (B) of the invention, vinyl polymers (for example, homopolymers and copolymers of (meth)acrylic acid, maleic acid, maleic acid monoester, allylamine, parahydroxystyrene, or the like), condensation polymerization type resins (such as phenol resins, amino acid resins, polyamide resins, polyester resins, epoxy resins, melamine resins or the like), and mixtures of two kinds or more of these polymers are illustrated. In the description herein, "(meth)acrylic - - - " refers to "acrylic - - - " and/or "methacrylic - - - "- and the same applies hereinafter.

Among these polymers, the preferable polymers are vinyl polymers or phenol resins. The homopolymers or the copolymers of (meth)acrylic acid, and the homopolymers or the copolymers of maleic acid or maleic acid monoester are the most preferable polymers.

In the above mentioned polymers (B), the molecular weight of the vinyl polymer is normally from 2,000 to 50,000, more preferably from 3,000 to 30,000. The molecular weight of the condensation polymerization type resin is normally from 500–50,000, more preferably from 1,000 to 10,000. The polymerization degree of the vinyl polymer is usually 20–500, preferably 30–300. The polymerization degree of the condensation polymerization type resin, in addition, is normally 5–350, preferably 10–100. The molecular weight distribution of the vinyl polymer is usually less than 5, more preferably less than 3. The molecular weight distribution of the condensation polymerization type resin, moreover, is normally less than 10, more preferably less than 5.

The copolymerizable monomer component in the vinyl polymer is, for example, 2-hydroxyethyl(meth)acrylate; acrylamide; N, N-dimethylacrylamide; acrylonitrile; diacetone acrylamide; N-vinyl-2-pyrrolidone; vinyl acetate; methyl(meth)acrylate; allyl alcohol; methyl vinyl ether; ethyl vinyl ether; propyl vinyl ether; butyl vinyl ether; and mixtures of two or more kinds of these monomers. For example, it is preferable to use 2-hydroxyethyl(meth)acrylate or diacetone acrylamide as a comonomer component when the principal monomer component is (meth)acrylic acid. Also, methyl vinyl ether is preferably used as comonomer component in case of maleic acid or maleic acid monoester. It is also preferable to use allyl alcohol as the comonomer component in case of allylamine. 2-hydroxyethyl(meth)acrylate is preferably used as a comonomer component in case of parahydroxystyrene.

The copolymerization ratio of copolymer monomer is less than 70% at mol ratio, more preferably 10–50%.

Specific examples of polymer (B) of the invention are a copolymer of (meth)acrylic acid with 2-hydroxyethyl(meth)acrylate, a copolymer of maleic acid monobutyl ester with methyl vinyl ether, a homopolymer of allylamine, a phenolnovolak resin and the like, more preferably the copolymer of (meth)acrylic acid with 2-hydroxyethyl(meth)acrylate or the copolymer of maleic acid monobutyl ester with methyl vinyl ether.

It is preferable that polymer (B) is substantially free of sulfonate groups.

The sensitivity is intensified as the number of active groups which are reactive to epoxide in the molecules increases. However, if the number is too large, the photosensitive resin is likely to become too viscous during storage of the resin.

In order to minimize environmental pollution and protect the safety of workers, the photosensitive resin is preferred to be water soluble. The methods of adding water soluble properties to the photosensitive resin are as follows:

① preparing a water soluble polymer (B) by using a homopolymer or a copolymer comprising a water soluble monomer component; and ② neutralizing active groups reactive to the epoxide, which are left after the reaction between compound (A) and polymer (B), with alkali or acid which can form a salt with the active groups.

A method of manufacturing the photosensitive resin of the invention includes the steps of:

dissolving compound (A), polymer (B) and, if necessary, catalyst (for example, quaternary ammonium salt or triphenylphosphine) in a solvent such as methyl cellosolve; and reacting at 60°14 100° C. for 5–30 hours.

The mol ratio of compound (A) relative to the active groups which are reactable to the epoxide in polymer (B) is normally less than 50%, preferably 10–30%. As this ratio increases, the sensitivity of the photosensitive resin increases. However, if the ratio is too large, the resin becomes too viscous during storage of the resin.

If required, unreacted carboxyl groups, which are reactive to epoxide, are neutralized with alkali, thus adding hydrophilic properties to the photosensitive resin.

Other polymers can be added to the photosensitive resin of the invention, if necessary. Film-forming properties as well as reactivity to light are improved due to the addition of a polymer to the photosensitive resin. Any polymers, soluble in the photosensitive resin of the invention, can be used. Among synthetic polymers, for instance, such polymers include homopolymers and copolymers of vinyl monomers (such as polyvinylpyrrolidone, polyvinylalcohol, polyacrylamide or the like), phenol resins, polyamide resins, polyester resins, polyimide resins and the like. As examples of the natural polymers, starch, cellulose, gelatin, casein, glue, natural rubber and the like are included. The amount of polymer added to the photosensitive resin of the invention is normally less than 1,000%, more preferably 50–600% by weight of the photosensitive resin. Two or more kinds of these polymers, instead of just one, can also be added to the photosensitive resin.

If neccesary, photo crosslinking agents may be added to the photosensitive resin of the invention, thus improving its sensitivity. Examples of such photo crosslinking agents include acrylic acid ester type monomers, arylic acid ester oligomers (for example, ethyleneglycoldiacrylate, trimethylolpropanetriacrylate, epoxiacrylate or the like), diazo compounds (such as condensation product of p-diazodiphenylamine and paraformaldehyde or the like), azido compounds (for instance, 4, 4'-diazidostilbene-2, 2'-disulfonic acid Na salt; 2,6-di(4'-azidobenzal)cyclohexane or the like), bichromate type compounds (such as ammonium bichromate, sodium bichromate or the like), cinnamic acid ester type compounds, and the like. The amount of photo crosslinking agent added to the photosensitive resin of the invention is normally less than 500%, preferably 10–200% by weight of the resin. Two or more kinds of these crosslinking agents can be added to the photosensitive resin.

If necessary, a surfactant can also be added to the photosensitive resin of the invention, thereby increasing the wettability of a coating film comprising the photosensitive resin. As long as the surfactant is soluble in the photosensitive resin, there is no limit to the particular kinds of surfactants. Examples of such surfactant include anionic surfactants, nonionic surfactants and cationic surfactants. Among these surfactants, nonionic surfactants such as alkylphenolethyleneoxide adducts (for example, nonylphenolethyleneoxide 10 mols adduct) are preferable. The amount of the surfactant added to the photosensitive resin of the invention is normally less than 10%, more preferably 0.1-5% by weight of the resin.

If necessary, an adhesion promoter may be added to the photosensitive resin of the invention. Examples of the adhesion promoter include silane type coupling agents (for instance, trimethoxysilane having an amino group, and the like), titanium type coupling agents, and the like. The amount of adhesion promoter added to the photosensitive resin of the invention is usually less than 10%, more preferably 0.1-5% by weight of the resin.

If necessary, a solvent may be added to the photosensitive resin of the invention, thus improving operation properties such as viscosity behavior during the coating step and storage stability and the like. As long as the solvent is soluble with the components of the photosensitive resin, the solvent is not limited to any particular kind. Examples of the solvent include water, alcoholic solvents (such as methanol, ethylalcohol, isopropylalcohol or the like), cellosolve type solvents (including methylcellosolve, ethylcellosolve, butylcellosolve or the like), diethyleneglycolmonoether type solvents (for instance, diethyleneglycolmonomethylether, diethyleneglycolmonoethylether or the like), amide type solvents (such as N-methyl-2-pyrrolidone; dimethylformamide; N, N-dimethylacetoamide or the like) and the like. The solvent can be used either alone or mixture of these solvents. The amount of solvent added to the photosensitive resin of the invention is normally 5,000%, more preferably 500-4,000% by weight of the resin.

Moreover, if necessary, fillers may be added to the photosensitive resin of the invention, thereby improving the heat-resisting properties, electrical properties, etc. of the photosensitive resin. For example, calcium carbonate, mica, kaolin, talc, aluminium silicate, barium sulfate, pulverized silica, clay and the like are used as such fillers. The amount of fillers added to the photosensitive resin of the invention is usually less than 500%, more preferably 50-200% by weight of the photosensitive resin. Two or more kinds of these fillers can be added to the photosensitive resin.

If necessary, the photosensitive resin of the invention can be colored by adding a color pigment or a dye to the resin. Examples of color pigment include phthalocyanine type pigments, titanium oxides, carbon blacks and the like. For example, azo dyes, anthraquinone dyes, indigoid dyes, sulfur dyes, triphenylmethane dyes, pyrazolone dyes, stilbene dyes, diphenylmethane dyes, xanthene dyes, alizarin dyes, acridine dyes, quinone imine dyes, thiazole dyes, methine dyes, nitro dyes, nitroso dyes, and the like are practical as dye for the invention. The amount of color pigment or dye added to the photosensitive resin of the invention is usually less than 50%, more preferably 0.5-10% by weight of the resin. Two or more kinds of the color pigment or dye may be added to the resin.

Substrates used to form the photosensitive resin of the invention on their surfaces include inorganics (metals such as iron, aluminum, silicon, copper, alloys of these metals, tin, galvanized sheet steel or the like; ceramic products such as roof tiles, slates, tiles, porcelain enamels, cement, bricks, glass or the like; etc.) and organics such as synthetic resins, papers, fibers, wood, leather, etc.

The photosensitive resin of the invention is coated on the surface of the substrate by such methods as a spin coater method, an air doctor coater method, a blade coater method, a knife coater method, a rod coater method, a positive rotational roll coater method, a reverse roll coater method, a gravure coater method, a rotary screen method, a kiss coater method, a bead coater method, a dip coating method, a slot orifice coater method, a spray coating method, a cast coating method, a powder coating method, an electrochemical deposition coating method, a vacuum coating method, an extrusion coating method, a Langmuir-Blogett (LB) technique, a brush coating method, a spatula coating method, or the like.

The photosensitive resin of the invention is cured by irradiation with light. The dosage of light, which is converted into 365 nm wavelength energy, is usually less than 50 mJ/cm$^2$. The temperature during irradiation is from room temperature to 50°C., more preferably from room temperature to 30°C. For example, low pressure mercury lamps, intermediate pressure mercury lamps, high pressure mercury lamps, extra-high pressure mercury lamps, xenon lamps, metal halogen lamps, electron beam irradiation equipment, X-ray irradiation equipment, lasers (such as an argon laser, a dye laser, a nitrogen laser, a helium cadmium laser, a YAG laser or the like), etc. are used for the irradiation.

Developing methods include a spraying method, a dipping method, and the like. Any developing solution which can dissolve the photosensitive resin can be used in the invention. Such a solution, for instance, organic solvents, alkali, neutral or acidic aqueous solutions, aqueous solutions containing surfactants, and mixtures of two or more kinds of these solvents or solutions.

EXAMPLES

The invention will now be explained specifically in the following examples, but the invention is not limited to these examples.

EXAMPLE 1

A water soluble photosensitive resin solution (a) was prepared in the following steps:

dissolving 2.2 g of a copolymer of acrylic acid and 2-hydroxyethylacrylate (mol ratio=acrylic acid: 2hydroxyethylacrylate=6:4, and molecular weight=4,400), 2.0 g of 4-azido-4'-glycidexychalcone, and 0.3 g of benzyltrimethylmmonium chloride into 25 g methylcellosolve;

reacting the dissolved materials at 60° C. for 20 hours, thus preparing a photosensitive resin solution; and neutralizing the solution with 159% by weight of tetramethylammonium hydroxide, thereby making the solution water soluble.

A photosensitive resin composition was prepared by mixing and dissolving materials mentioned below at the following ratio.

| | |
|---|---|
| Water soluble photosensitive resin solution (a) | 10 parts |

| Polyvinylpyrrolidone ("PVP K-90" manufactured by International Specialty Products Inc. (ISP Inc.)) | 7 parts |
|---|---|
| Nonylphenolethyleneoxide 10 mols adduct ("NONIPOL" manufactured by Sanyo Chemical Industries, Ltd.) | 0.03 parts |
| N-β-(aminoethyl)-γ-amino propyltrimethoxysilane | 0.07 parts |
| Ion-exchanged water | 50 parts |

The obtained composition was spin-coated on a glass plate by a spin coater, thus forming a coating film with 1.2 μm film thickness. The film was then contacted tightly with a photomask having 20 μm line-and-space, exposed to an extra-high pressure mercury lamp of 250 W, dipped and held in ion-exchanged water at 25° C. for 30 seconds, and finally developed. A remainder/film ratio was measured by the ratio of film thickness before and after development. The exposure energy required to provide a 50% remainder/film ratio was 3.4 mJ/cm$^2$.

As a comparative example, a photosensitive resin composition disclosed in Published Unexamined Japanese Patent Application No. Sho 64–13540 was prepared by mixing and dissolving the following materials.

| Acrylamide-diacetoneacrylamide copolymer (mol ratio = 60:40) | 5 parts |
|---|---|
| Acrylamide-diacetoneacrylamide copolymer (mol ratio = 72:28) | 5 parts |
| 4, 4'-diazidostilbene-2, 2'-sodium disulfonate | 2 parts |
| Nonylphenolethyleneoxide 10 mols adduct ("NONIPOL 100" manufactured by Sanyo Chemical Industries, Ltd. | 0.05 parts |
| Ion-exchanged water | 90 parts |

The exposure energy required to provide a 50% remainder/film ratio of the coating film formed from the composition of this comparative example was 9.2 mJ/cm$^2$. In other words, the sensitivity of the coating film formed from the photosensitive resin of the invention is 2.7 times higher than that of the coating film of this comparative example.

As another comparative example, the photosensitive resin composition disclosed in Published Unexamined Japanese Patent Application No. Hei 4–50205 was prepared by mixing and dissolving the following materials.

| Sodium maleate-vinylmonoazide cinnamoylketone sodium sulfonate copolymer | 3 parts |
|---|---|
| Acrylamide-diacetoneacrylamide copolymer | 17 parts |
| Ion-exchanged water | 500 parts |

The exposure energy required to provide a 50% remainder/film ratio of the coating film formed from the composition of this comparative example was 4.0 mJ/cm$^2$. Compared with the coating film formed from the photosensitive resin of the invention, however, this coating film had an extremely dark red brown color. This film, in addition, swelled during development, and a practical development pattern was not provided. In other words, since many azo type conjugated compounds having high absorbance were generated in this coating film, the permeation of light was prevented. As a result, the inside of the film of this comparative example was not fully cured, thus generating deficiency in adhesion and swelling.

EXAMPLE 2

A water soluble photosensitive resin solution (b) was prepared in the following steps: dissolving 3.0 g of phenolnovolak resin (molecular weight=1,200), 2.3 g 4-azido-4'-glycidexychalcone, and 0.3 g of benzyltrimethylammoniumbromide into 30 g methylcellosolve;

reacting the dissolved materials at 80% for 20 hours, thus preparing a photosensitive resin solution; and neutralizing the solution with sodium hydroxide, thus providing a water soluble photosensitive resin solution.

A photosensitive resin composition was prepared by mixing and dissolving materials mentioned below at the following ratio.

| Water soluble photosensitive resin solution (b) | 12 parts |
|---|---|
| Polyvinylpyrrolidone ("PVP K-90" manufactured by ISP Inc.) | 9 parts |
| Nonylphenolethyleneoxide 10 mols adduct ("NONIPOL" manufactured by Sanyo Chemical Industries, Ltd.) | 0.02 parts |
| N-β-(aminoethyl)-γ-amino propyltrimethoxysilane | 0.02 parts |
| Ion-exchanged water | 50 parts |

In this example, the exposure energy required to provide a 50% remainder/film ratio was 3.8 mJ/cm$^2$. In other words, the sensitivity of the coating film formed from the photosensitive resin of this example is 2.4 times higher than that of the coating film of the first comparative example. The film formed from the photosensitive resin of this example did not swell during development.

EXAMPLE 3

A water soluble photosensitive resin solution (c) was prepared in the following steps:

dissolving 1.8 g of polyallylamine (molecular weight=6,200), 2.0 g of 4-azido-4'-glycidoxychalcone, and 0.2 g of benzyltrimethylammoniumbromide into 20 g methylcellosolve;

reacting the dissolved materials at 60% for 15 hours, thus preparing a photosensitive resin solution; and neutralizing the solution with hydrochloric acid, thus providing a water soluble photosensitive resin solution.

A photosensitive composition was prepared by mixing and dissolving materials mentioned below at the following ratio.

| Water soluble photosensitive resin solution (c) | 10 parts |
|---|---|
| Polyvinyl alcohol (98% saponification) | 9 parts |
| Nonylphenolethyleneoxide 10 mols adduct ("NONIPOL 100" manufactured by Sanyo Chemical Industries, Ltd.) | 0.03 parts |
| Ion-exchanged water | 50 parts |

The exposure energy required to provide a 50% remainder/film ratio was 3.5 mJ/cm$^2$ in this example. In other words, the sensitivity of the coating film formed from the photosensitive resin of this example is 2.6 times higher than that of the coating film of the first comparative example. The film formed from the photosensitive resin of this example did not swell during development.

EXAMPLE 4

A water soluble photosensitive resin solution (d) was prepared in the following steps:

dissolving 2.3 g of a copolymer of maleic acid monobutyl ester and methyl vinyl ether (mol ratio=maleic acid monobutyl ester: methyl vinyl ether=1:1, and molecular weight=11,000), 0.73 g of 4-azido-4'-glycidoxychalcone, and 0.35 g of benzyltrimethylammoniumchloride into 30 g of diethyleneglycolmonomethylether;

reacting the dissolved materials at 60% for 22 hours, thus preparing a photosensitive resin solution; and neutralizing the solution with 2-amino-2-methyl-1propanol, thereby making the solution water soluble.

A photosensitive resin composition was prepared by mixing and dissolving materials mentioned below at the following ratio.

| | |
|---|---:|
| Water soluble photosensitive resin solution (d) | 12 parts |
| Polyacrylamide | 6 parts |
| Nonylphenolethyleneoxide 9 mols adduct ("NONIPOL 90" manufactured by Sanyo Chemical Industries, Ltd.) | 0.01 parts |
| N-β-(aminoethyl)-γ-amino propyltrimethoxysilane | 0.02 parts |
| Ion-exchanged water | 50 parts |

The exposure energy required to provide a 50% remainder/film ratio was 3.9 mJ/cm$^2$ in this example. In other words, the sensitivity of the coating film formed from the photosensitive resin of this example is 2.4 times higher than that of the coating film of the first comparative example. The film formed from the photosensitive resin of this example did not swell during development.

EFFECT OF THE INVENTION

Since the photosensitive resin of the invention has at least one azido group in a molecule having an absorption region larger than 300 nm, the resin is highly sensitive. Moreover, the azido groups are not gathered with each other so that an azo type conjugated compound with high absorbancy of light is not formed. Therefore, the photosensitive resin of the invention has excellent quality, because, curing is completely done into the inner parts of the film. Thus, the photosensitive resin of the invention is useful as a photo resist for LSI, an etching photo resist for printed wiring boards, a photo solder resist for printed wiring boards, an electrodeposition resist for printed wiring boards, a photo resist for manufacturing printing plates (such as a planographic printing plate, an intaglio printing plate, a letter press printing plate, a gravure printing plate, a flexographic plate, and the like), a relief mask for sand blasting, a photo resist for creating decorative patterns, a photo resist for manufacturing screen printing plates, a photo resist for manufacturing nameplates, a photo resist for manufacturing cathode ray tube black matrices, a photo resist for manufacturing cathode ray tube phosphor screens, a photo resist for etching metals, a photo resist for manufacturing indium tin oxide (ITO) patterns for liquid crystal display, a photo resist for manufacturing color filters for liquid crystal display, photoadhesives, ultraviolet curing ink, ultraviolet curing paints, ion exchange resins (membranes), permselective membranes, immobilized enzyme membranes, and the like.

The photosensitive resin of the invention has an azido group in a molecule having an adsorption region higher than 300 nm, and is highly sensitive as mentioned previously. Therefore, an emulsion coating photo mask or a soda glass photo mask, which allows light permeation within the absorption region of the azido group and is available inexpensively in the industry, can be used as a photo mask for the photosensitive resin of the invention. Thus the photosensitive resin is particularly useful as a photo resist.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A photosensitive resin comprising a polymer having at least one side chain represented by formula (1):

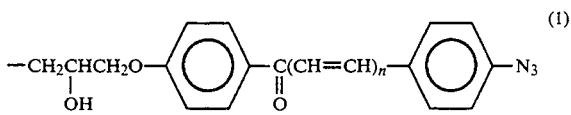

wherein n represents an integer from 1 to 10.

2. A photosensitive resin according to claim 1 being derived from the reaction between a compound (A) represented by a following Chemical Formula (2) and a polymer (B) having at least one active group reactable to epoxide in a molecule;

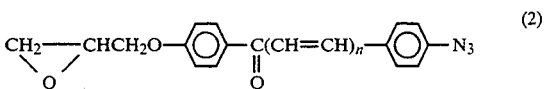

wherein n represents an integer from 1 to 10.

3. A photosensitive resin according to claim 2, wherein the active group contained in the polymer (B) is at least one group selected from the group consisting of a carboxyl group, an amino group and a phenolic hydroxyl group.

4. A photosensitive resin according to claim 3, wherein the polymer (B) is a vinyl polymer having a carboxyl group in a molecule.

5. A photosensitive resin according to claim 4, wherein the polymer (B) is a homopolymer or a copolymer of (meth)acrylic acid.

6. A photosensitive resin according to claim 4, wherein the polymer (B) is a homopolymer or a copolymer of maleic acid or maleic acid monoester.

7. A photosensitive resin according to claim 2, wherein the polymer (B) is a vinyl polymer having an amino group.

8. A photosensitive resin according to claim 2, wherein the polymer (B) is a phenol resin.

9. A photosensitive resin according to claim 1, wherein the photosensitive resin is a water soluble photosensitive resin.

* * * * *